United States Patent
Lee et al.

(10) Patent No.: US 7,462,504 B2
(45) Date of Patent: Dec. 9, 2008

(54) SURFACE-EMITTING TYPE LIGHT-EMITTING DIODE AND FABRICATION METHOD THEREOF

(75) Inventors: Kie Young Lee, Seoul-si (KR); Shi Jong Leem, Seoul-si (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 11/488,084

(22) Filed: Jul. 18, 2006

(65) Prior Publication Data
US 2006/0258029 A1 Nov. 16, 2006

Related U.S. Application Data

(62) Division of application No. 10/636,591, filed on Aug. 8, 2003, now Pat. No. 7,112,821.

(30) Foreign Application Priority Data
Aug. 9, 2002 (KR) ............... 2002-47158
Aug. 9, 2002 (KR) ............... 2002-47159

(51) Int. Cl.
*H01L 29/72* (2006.01)

(52) U.S. Cl. .............. 438/38; 438/39; 438/412; 438/465; 438/696; 438/699

(58) Field of Classification Search ........ 438/38, 438/39, 412, 465, 696, 699
See application file for complete search history.

(56) References Cited

U.S. PATENT DOCUMENTS

| | | | |
|---|---|---|---|
| 5,489,993 A * | 2/1996 | Ito et al. | 358/482 |
| 5,567,052 A * | 10/1996 | Yoshiike et al. | 374/124 |
| 6,063,643 A * | 5/2000 | Dutta | 438/39 |
| 6,654,399 B1* | 11/2003 | Kimura et al. | 372/50.1 |
| 6,711,191 B1 | 3/2004 | Kozaki et al. | |
| 2003/0006230 A1 | 1/2003 | Kaji et al. | |
| 2003/0183827 A1 | 10/2003 | Kawaguchi et al. | |
| 2004/0046180 A1* | 3/2004 | Takaoka | 257/98 |
| 2005/0247948 A1* | 11/2005 | Moku et al. | 257/94 |

FOREIGN PATENT DOCUMENTS

| | | |
|---|---|---|
| DE | 10008240 A1 | 10/2000 |
| JP | 07-079015 A | 3/1995 |
| JP | 09-074219 A | 3/1997 |

* cited by examiner

*Primary Examiner*—Edward Wojciechowicz
(74) *Attorney, Agent, or Firm*—Birch, Stewart, Kolasch & Birch, LLP

(57) ABSTRACT

A surface-emitting type light-emitting diode includes a substrate, a p-n junction layer elevated on a portion of the substrate to emit light, and a first isolator layer formed on a sidewall of the p-n junction layer as well as a periphery portion of a top surface of the p-n junction layer except for a central region of the top surface.

13 Claims, 7 Drawing Sheets

SURFACE-EMITTING TYPE LIGHT-EMITTING DIODE AND FABRICATION METHOD THEREOF

This application is a Divisional of application Ser. No. 10/636,591 filed on Aug. 8, 2003 now U.S. Pat. No. 7,112,821, and for which priority is claimed under 35 U.S.C. § 120; and this application claims priority of Application No. 47158/2002 and 47159/2002 filed in Korea on Aug. 9, 2002 under 35 U.S.C. § 119; the entire contents of all are hereby incorporated by reference.

BACKGROUND OF THE INVENTION

1. Field of the Invention

The present invention relates to a surface-emitting type light-emitting diode, and more particularly, to a surface-emitting type light-emitting diode that can accurately measure a distance by emitting light only from a desired surface thereof. The present invention is further directed to a method for fabricating such a surface-emitting type light-emitting diode.

2. Description of the Related Art

Generally, a light-emitting diode (LED) is a device converting an electric energy into a light energy with a high efficiency to thereby obtain a high output at a low current. In addition, the LED has a high response speed, and enables the high-frequency modulation. Furthermore, the LED is designed such that the light output thereof can be readily varied by a current control and it is controlled by either a direct or alternating current.

Such an LED can be employed to a variety of applications such as a sensor device and a distance-measuring device as it can be designed to be small-sized and lightweight with a long lasting and low power consumption. Particularly, the LED has been used as a device for measuring a distance in an iris scan system.

As is well known, the iris scan system is a security system to certify a personal identification to allow only the certified person to enter into a limited area or to access limited information. The iris scan system has a high recognition rate and accuracy compared with a fingerprint scan system.

The iris scan system takes a photograph of an iris, makes image data by image-processing a typical pattern of the photographed image, and compares the image data with a pre-registered iris data, thereby certifying a personal identification.

In such an iris scan system, a position sensitive detector (PSD) for measuring a distance to a user has been used. The PSD has a light emission part and a light reception part. When light is emitted from the light emission part, the light reception part receives the light reflected from an object to measure the distance between the object and the PSD using a triangular surveying. However, the PSD is too expensive to be employed to the iris scan system that should be widely used with moderate prices. In addition, the PSD occurs frequent errors in measuring the distance.

Accordingly, a low-priced iris scan system using the LED has been developed to measure the distance by catching a location of the LED appearing on a photographed image. That is, by installing a pre-calculated algorithm in the iris scan system, the distance to the object can be accurately and quickly measured by detecting the location of the LED appearing on the photographed image.

However, such a conventional surface-emitting type LED has a problem that can be described in conjunction with FIG. 1 showing a side-emitting problem of the conventional surface-emitting type LED.

That is, as shown in FIG. 1, even with a masking process, the conventional surface-emitting type LED 100 is designed to emit light from a peripheral light-emitting region 120 as well as a desired emitting region 110. Therefore, in the iris scan system employing such a conventional surface-emitting type LED, the accuracy of the measurement of the object distance is deteriorated due to the light emission at the peripheral light-emitting region 120.

SUMMARY OF THE INVENTION

Accordingly, the present invention is directed to a surface-emitting type LED and a method for fabricating the same that substantially obviate one or more problems due to limitations and disadvantages of the related art.

An object of the present invention is to provide a surface-emitting type LED and a method for fabricating the same that accurately measure a distance by preventing the light emission at a peripheral surface region thereof.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a surface-emitting type light-emitting diode comprising a substrate; a p-n junction layer elevated on a portion of the substrate to emit light; and an isolator layer formed on a sidewall of the p-n junction layer as well as a periphery portion of a top surface of the p-n junction layer except for a central region of the top surface.

In another aspect of the present invention, there is provided a surface-emitting type light-emitting diode comprising a substrate; a p-n junction layer to emit light having an n-type epitaxial layer elevated on a portion of the substrate and a p-type epitaxial layer formed on a central region of a top surface of the n-type epitaxial layer; and an isolator layer formed on a sidewall of the p-n junction layer as well as a periphery portion of a top surface of the p-n junction layer except for a central region of the top surface.

In still another aspect of the present invention, there is provided a method for fabricating a surface-emitting type light-emitting diode. The method comprises the steps of depositing a p-n junction layer on a substrate; etching the p-n junction layer and the substrate to divided the p-n junction layer into a plurality of blocks elevated on the substrate in a matrix-shape; forming an isolator layer on a sidewall of the p-n junction layer as well as a periphery portion of a top surface of the p-n junction layer except for a central region of the top surface; and cutting the blocks to provide a plurality of light-emitting diodes.

In still yet another aspect of the present invention, there is provided a method for fabricating a surface-emitting type light-emitting diode. The method comprises the steps of depositing an n-type epitaxial layer on a substrate; etching the n-type epitaxial layer and the substrate to divide the n-type epitaxial layer into a plurality of blocks elevated on the substrate in a matrix-shape; forming an isolator layer on a sidewall of the n-type epitaxial layer as well as a periphery portion of a top surface of the n-type epitaxial layer except for a central region of the top surface; forming a p-n junction by forming a p-type epitaxial layer on a top surface of the n-type epitaxial layer by doping p-type ions; and cutting the blocks to provide a plurality of light-emitting diodes.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings.

First Embodiment

Figure 1:
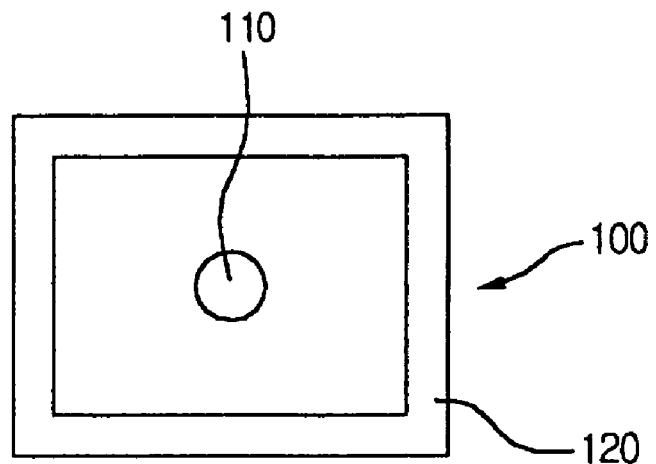
FIG. 1 is a schematic view of a conventional surface-emitting type LED illustrating a peripheral light-emitting phenomenon.
Figure 2A:
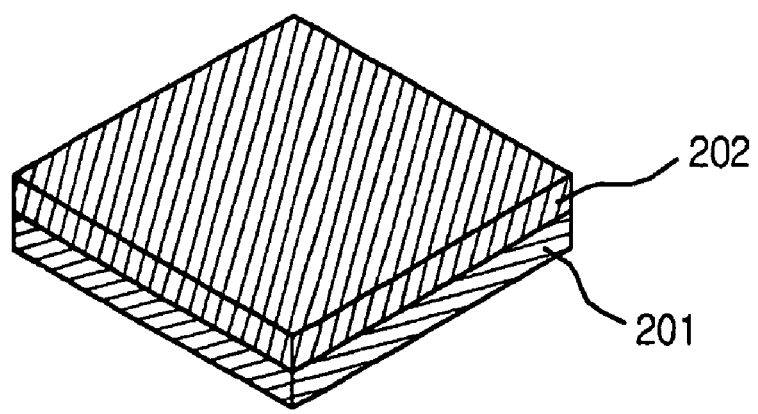
FIGS. 2A to 2C are views illustrating a method for fabricating a surface-emitting type LED according to a first embodiment of the present invention.
Figure 2B:
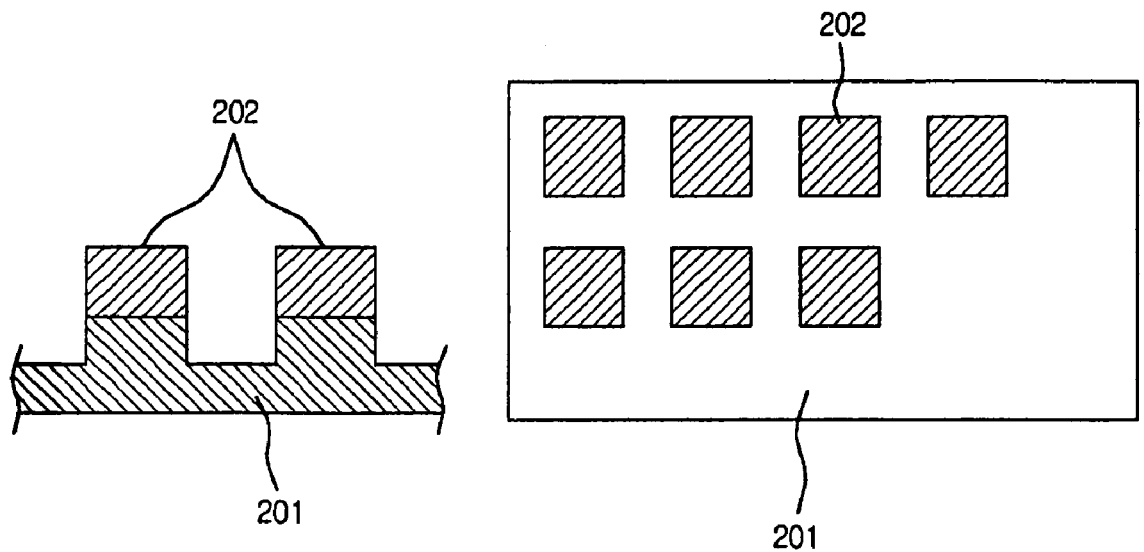
Figure 2C:
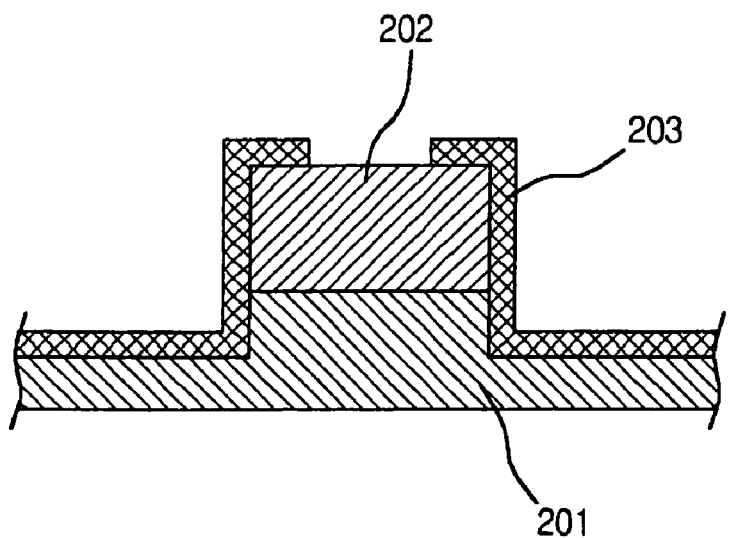

FIGS. 2A to 2C show a method for fabricating a surface-emitting type LED according to a first embodiment of the present invention.

Referring first to FIG. 2A, an epitaxial layer 202 is first deposited on a substrate 201, thereby forming a wafer.

Here, the epitaxial layer 202 deposited on the substrate 201 is a p-n junction layer formed by layering an n-type clad layer, an active layer, and a p-type clad layer in this order. Although it is not shown in the drawing, a buffer layer may be further formed between the substrate 201 and the epitaxial layer 202.

Afterwards, the wafer deposited with the epitaxial layer 202 is cleaned, and the epitaxial layer 202 and the substrate 201 are etched in a predetermined patterned as shown in FIG. 2B.

Describing in more detail, before the pattern is formed, a photoresist layer is deposited on the wafer at a predetermined thickness through, for example, a spin coating process.

After the above, a mask having a desired pattern is disposed on the photoresist layer, and a light exposure process is performed by illuminating ultraviolet rays. Then, a developing process is performed using a developing solution, thereby developing the pattern by use of a solubility difference between the light-exposing portion and the non-exposing portion, after which an etching process is performed to obtain the pattern as shown in FIG. 2B. That is, the epitaxial layer 202 and the substrate 201 are etched such that the epitaxial layer 202 can be divided into a plurality of blocks in a matrix-shape on the substrate 201.

Afterwards, as shown in FIG. 2C, an isolator layer 203 is formed on each block of the epitaxial layer 202 by use of a lift-off process.

Describing the lift-off process in brief, a photoresist layer is formed in a desired pattern and a thin film layer is formed on the photoresist layer. Then, a portion of the thin film layer, which is formed on the photoresist layer, is removed together the photoresist layer such that only a portion of the thin film layer, which is not formed on the photoresist layer, is remained, thereby forming a desired pattern of the thin film layer. Since such a lift-off process is well known in the art, the detailed description thereof will be omitted herein.

Further describing the process for forming the LED as shown in FIG. 2C, a photoresist layer (not shown) is first patterned on a desired central light-emitting region of the blocks of the epitaxial layer 202 elevated on the substrate 201, and the isolating layer 203 is then deposited covering the substrate 201, the photoresist layer, and the epitaxial layer 202.

Here, the isolating layer 203 is formed of oxide such as $SiO_2$ and $Al_2O_3$ or polymer, and is deposited at a thickness of about 1-30 μm through a sputtering process. At this point, the isolator layer 203 is formed of a plurality of oxide layers, having a predetermined thickness in accordance with a refraction index of the oxide used. That is, the thickness is set to be about $\lambda/4n$ (where, the $\lambda$ indicates wavelength of light emitted from the LED, and the n indicates the refraction index of the material of the isolator layer).

Afterwards, a portion of the isolator layer 203 formed on the photoresist layer is removed together with the photoresist layer, thereby obtaining a desired pattern of the isolator layer 203 as shown in FIG. 2C.

The wafer having the plurality of blocks in the matrix-shape is then cut to obtain a plurality of LEDs.

The LED fabricated as in the above is designed to emit light only at the exposed region of the epitaxial layer 202. Therefore, when the iris scan system employs such an LED, the object distance can be more accurately measured.

Second Embodiment

FIGS. 3A to 3D show a method for fabricating a surface-emitting type LED according to a second embodiment of the present invention.

Figure 3A:
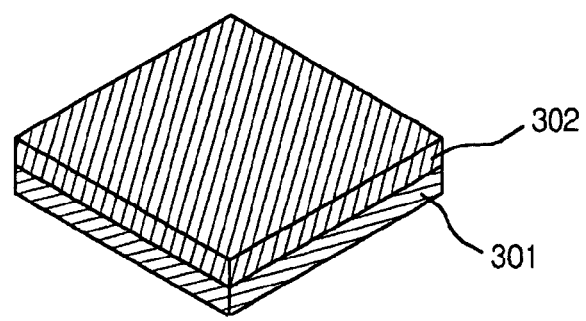
FIGS. 3A to 3D are views illustrating a method for fabricating a surface-emitting type LED according to a second embodiment of the present invention.

Referring first to FIG. 3A, an epitaxial layer 302 is first deposited on a substrate 301, thereby forming a wafer.

Here, the epitaxial layer 302 deposited on the substrate 301 is a p-n junction layer formed by layering an n-type clad layer, an active layer, and a p-type clad layer in this order. Although it is not shown in the drawing, a buffer layer may be further formed between the substrate 301 and the epitaxial layer 302.

Figure 3B:
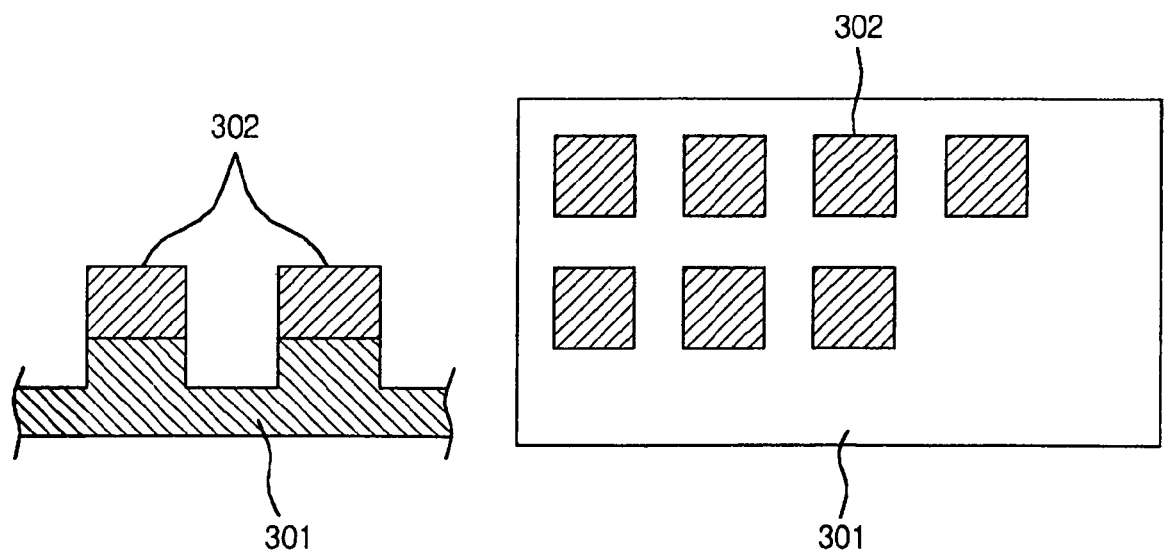

Afterwards, the wafer deposited with the epitaxial layer 302 is cleaned, and the epitaxial layer 302 and the substrate 301 are etched in a predetermined patterned as shown in FIG. 3B. That is, the epitaxial layer 302 and the substrate 301 are etched such that the epitaxial layer 302 can be divided into a plurality of blocks in a matrix-shape on the substrate 301.

Figure 3C:
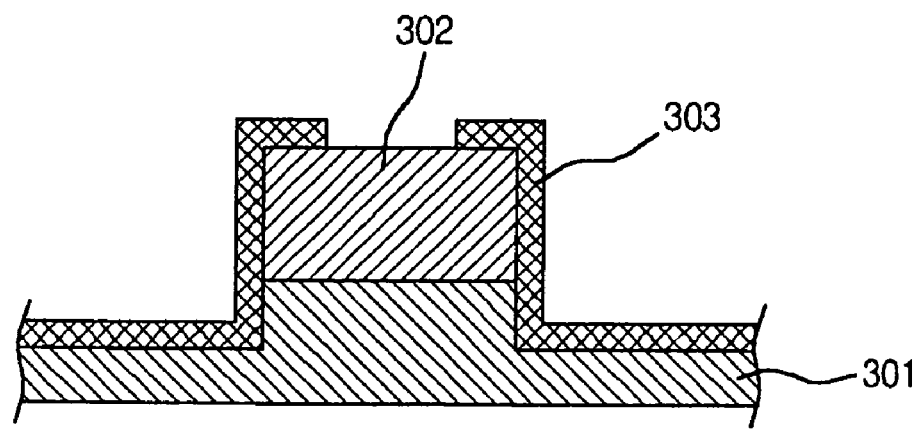

Afterwards, as shown in FIG. 3C, an isolator layer 303 is formed on each block of the epitaxial layer 302 by use of a lift-off process.

Further describing the process for forming the LED as shown in FIG. 3C, a photoresist layer (not shown) is first formed on a portion slightly larger than a desired central light-emitting region of the blocks of the epitaxial layer 302 elevated on the substrate 301, and the isolating layer 303 is then deposited covering the substrate 301, the photoresist layer, and the epitaxial layer 302.

Here, the isolating layer 303 is formed of oxide such as $SiO_2$ and $Al_2O_3$ or polymer, and is deposited at a thickness of about 1-30 μm using a sputtering process. At this point, the isolator layer 303 is formed of a plurality of oxide layers, having a predetermined thickness in accordance with a refraction index of the oxide used. That is, the thickness is set to be about λ/4n (where, the λ indicates wavelength of light emitted from the LED, and the n indicates the refraction index of the material of the isolator layer).

Afterwards, a portion of the isolator layer 303 formed on the photoresist layer is removed together with the photoresist layer, thereby obtaining a desired pattern of the isolator layer 303 as shown in FIG. 3C.

Figure 3D:
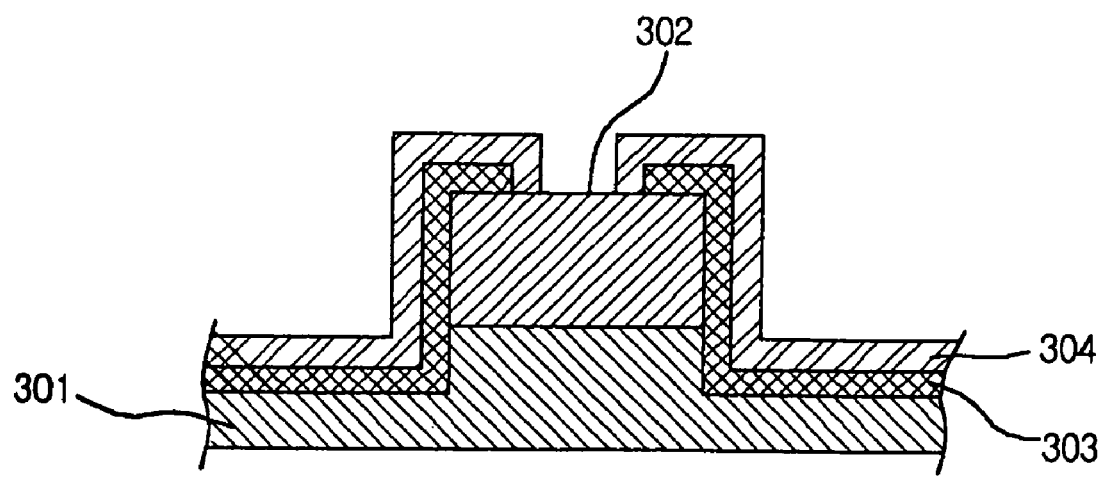

Next, as shown in FIG. 3D, a metal layer 304 is formed through the lift-off process.

That is, a photoresist layer (not shown) is formed on a desired central light-emitting region of the epitaxial layer 302 elevated on the substrate 301, after which the metal layer 304 is deposited covering the isolator layer 303, the epitaxial layer 302, and the photoresist layer.

Here, the metal layer 304 is formed of a material selected from the group consisting of Au, Ti, Al and Ag, or a combination thereof such Ti/Pt/Au. The metal layer has an identical property to a lead line enhancing the contacting force. At this point, the metal layer has a predetermined thickness, preferably, of about 1-30 μm.

Afterwards, a portion of the metal layer 304, which is formed on the photoresist layer, is removed together with the photoresist layer, thereby obtaining a pattern as shown in FIG. 3D.

After the above, the substrate 301 is cut into a plurality of the blocks having the matrix-shape, thereby fabricating a plurality of LEDs.

Accordingly, the LEDs having the above-described structure are designed to emit light only at the exposed region of the epitaxial layer 302. Therefore, when the iris scan system employs such an LED, the object distance can be more accurately measured.

Third Embodiment

FIGS. 4A to 4D show a method for fabricating a surface-emitting type LED according to a third embodiment of the present invention.

Figure 4A:
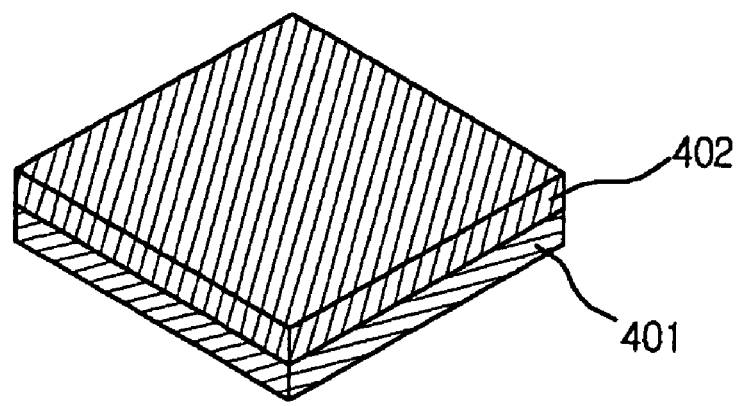
FIGS. 4A to 4D are views illustrating a method for fabricating a surface-emitting type LED according to a third embodiment of the present invention.

Referring first to FIG. 4A, an n-type epitaxial layer 402 is first deposited on a substrate 401, thereby forming a wafer.

Figure 4B:
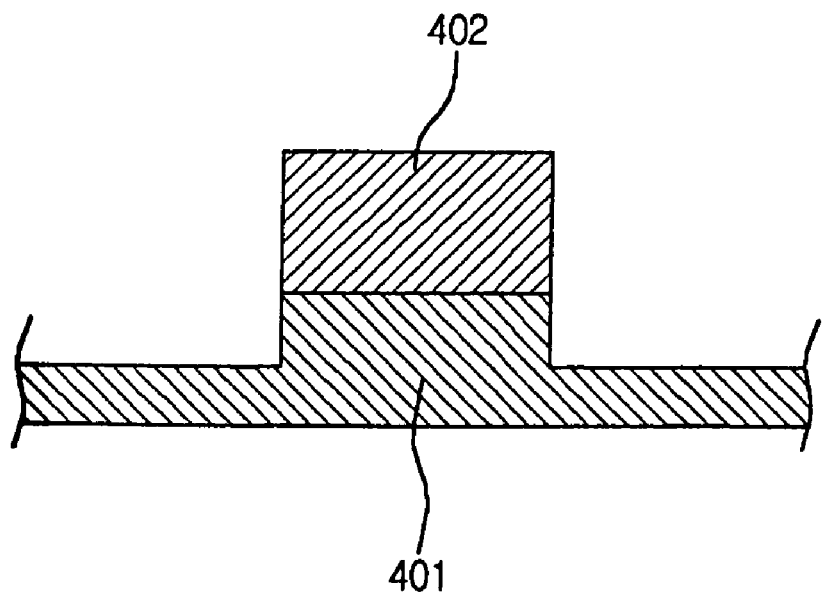

Afterwards, the wafer deposited with the n-type epitaxial layer 402 is cleaned, and the n-type epitaxial layer 302 and the substrate 301 are etched in a predetermined patterned as shown in FIG. 4B. That is, the n-type epitaxial layer 402 and the substrate 401 are etched such that the n-type epitaxial layer 402 can be divided into a plurality of blocks in a matrix-shape on the substrate 401.

Figure 4C:
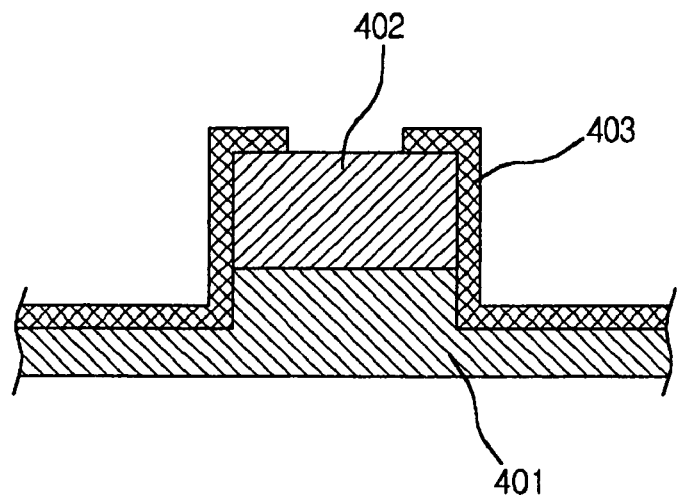

Afterwards, as shown in FIG. 4C, an isolator layer 403 is formed on each block of the epitaxial layer 402 through a lift-off process.

Further describing the process for forming the LED as shown in FIG. 4C, a photoresist layer (not shown) is first formed on a desired central light-emitting region of the blocks of the epitaxial layer 402 elevated on the substrate 401, and the isolating layer 403 is then deposited covering the substrate 401, the photoresist layer, and the epitaxial layer 402.

Here, the isolating layer 303 is formed of oxide such as $SiO_2$ and $Al_2O_3$ or polymer, and is deposited at a thickness of about 1-30 μm using a sputtering process. At this point, the isolator layer 403 is formed of a plurality of oxide layers, having a predetermined thickness in accordance with a refraction index of the oxide used. That is, the thickness is set to be about λ/4n (where, the λ indicates wavelength of light emitted from the LED, and the n indicates the refraction index of the material of the isolator layer).

Afterwards, a portion of the isolator layer 403 formed on the photoresist layer is removed together with the photoresist layer, thereby obtaining a desired pattern of the isolator layer 303 as shown in FIG. 4C.

Figure 4D:
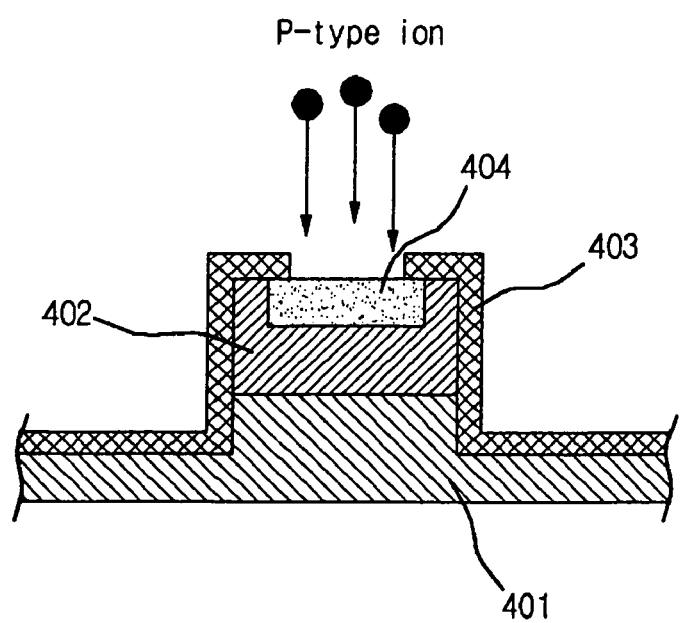

Next, as shown in FIG. 4D, p-type ions are doped in the n-type epitaxial layer 402 through an ion implantation process. At this point, the isolator layer 403 functions as a mask for doping the ions in the epitaxial layer 402. As a result, the p-type ions are doped in only a portion of the epitaxial layer 404, which is not covered with the isolator layer 403, thereby varying a predetermined upper portion of the n-type epitaxial layer 402 into a p-type epitaxial layer 404. At this point, the p-type epitaxial layer 404 has a thickness of about 10-30 μm.

The LED structured as in the above is designed to emit light only at a p-n junction of the n-type epitaxial layer 402 and the p-type epitaxial layer 404.

After the above, the substrate 401 is cut into a plurality of the blocks having the matrix-shape, thereby fabricating a plurality of LEDs.

Therefore, when the iris scan system employs such an LED, the object distance can be more accurately measured.

Meanwhile, the doped ions can be one of the n-type and p-type ions in accordance with the property of the wafer. That is, when the wafer is the p-type, the n-type ions are doped, and when it is the n-type, the p-type ions are doped.

Furthermore, when a p-n junction of the n-type epitaxial layer 402 and the p-type epitaxial layer 404 is formed through the ion implantation process, the light-emitting region can be formed in a specific shape by modifying the mask for blocking the ions. For example, when the shape of the mask is designed in a stick-shape or a heart-shape, the p-type epitaxial layer 404 formed by doping the p-type ions can be formed in the stick-shape or in the heart-shape. As a result, an LED that is designed to emit light having the stick-shape or the heart-shape can be realized.

Fourth Embodiment

As is well known, an electrode should be formed to drive a surface-emitting type LED. In the present invention, the electrode is not formed on an entire top surface of the epitaxial layer 502, but on a limited desired portion of the top surface. Here, the limited desired portion indicates a desire light-emitting region.

In addition, the epitaxial layer 502 deposited on a substrate 501 is a p-n junction layer formed by layering an n-type clad layer, an active layer, and a p-type clad layer in this order. Although it is not shown in the drawing, a buffer layer may be further formed between the substrate 501 and the epitaxial layer 502.

Describing in more detail, an ohmic metal layer 506 is deposited on a predetermined portion of a top surface of the epitaxial layer 502, and a bonding metal layer 507 is formed on the ohmic metal layer 506. That is, the ohmic metal layer 506 is not formed on the entire top surface of the epitaxial layer 502, but formed in a predetermined desired shape on the top surface of the epitaxial layer 502. Therefore, the ohmic metal layer appears in a plurality of blocks with a space from each other when it is viewed in a section as shown in FIG. 5.

When the ohmic metal layer is formed on the limited desired region, the current flows only at a region where the ohmic metal layer 506 and the bonding metal layer 507 are formed. That is, the current can be controlled such that it can flow only at a desired region, thereby making it possible to allow the light to be emitted only at the desired region.

In addition, to prevent the light from being leaked in a side direction, a light-shielding layer 508 formed in a multiple layer is formed on a sidewall and a peripheral portion of a top surface of the epitaxial layer 502.

Figure 5:
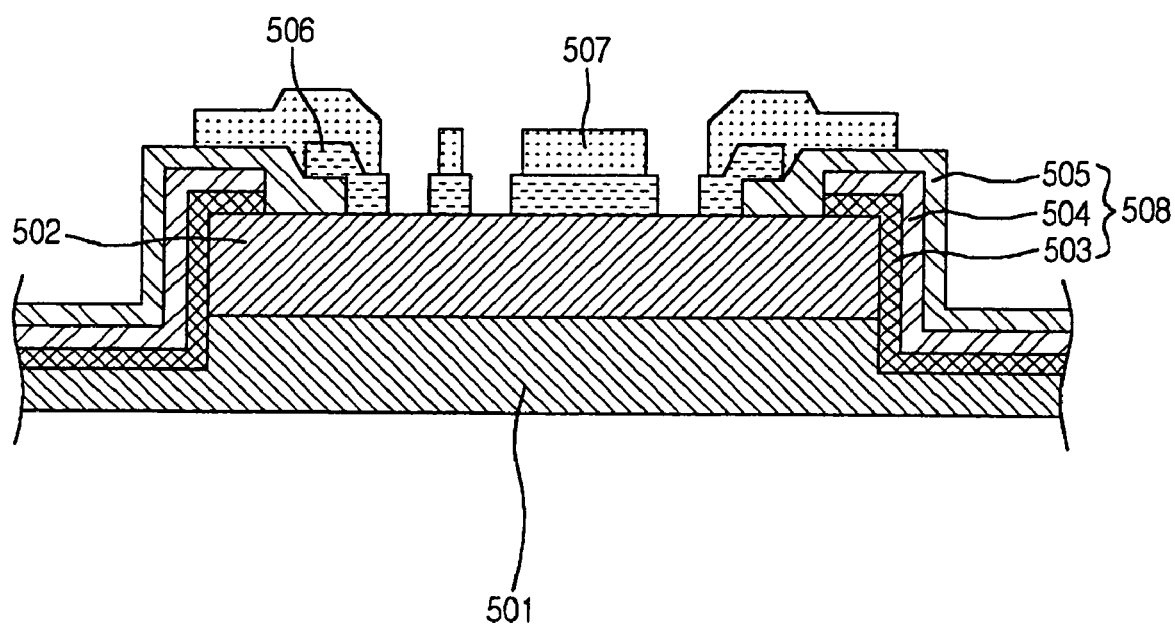
FIG. 5 is a sectional view of a surface-emitting type LED according to a fourth embodiment of the present invention.

That is, as shown in FIG. 5, the light-shielding layer 508 is comprised of a first isolator layer 503, a reflection layer 504, and a second isolator layer 505. The first and second isolator layers 503 and 505 are formed of an insulating material such as $SiO_2$, and the reflection layer 504 is formed of a metal material such as $TiO_2$.

Here, being formed of the metal material such as the TiO2, the reflection layer 504 enhances the bonding force between the first and second isolator layers 503 and 505 and the light-shielding layer 508 is formed to be thicker, thereby effectively preventing the light emitted from the epitaxial layer 502 from being leaked in a side direction.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method for fabricating a surface-emitting type light-emitting diode, the method comprising the steps of:
   depositing a p-n junction layer on a substrate;
   etching the p-n junction layer and the substrate to divide the p-n junction layer into a plurality of blocks elevated on the substrate in a matrix-shape;
   forming an isolator layer on a sidewall of the p-n junction layer as well as a periphery portion of a top surface of the p-n junction layer except for a central region of the top surface of the p-n junction layer;
   forming a metal layer on the isolator layer, wherein the metal layer is formed to have a thickness of about 1-30 μm, and wherein the metal layer is formed on the top surface of the p-n junction layer except for the central region of the top surface of the p-n junction layer and is formed to conformally cover the isolator layer; and
   cutting the blocks to provide a plurality of light-emitting diodes.

2. The method of claim 1, wherein the p-n junction layer is formed by layering a p-type clad layer, an active layer, and an n-type clad layer.

3. The method of claim 1, wherein the isolator layer is formed of oxide or polymer.

4. The method of claim 1, wherein The isolator layer is deposited having a thickness of about λ/4n (where, the λ indicates wavelength of light emitted from the LED, and the n indicates the refraction index of a material of the isolator layer).

5. The method of claim 1, wherein the isolator layer is formed through a lift-off process.

6. The method of claim 1, wherein the metal layer is formed of a material or a combination selected from the group consisting of Au, Ti, Al, Ag and Pt.

7. A method for fabricating a surface-emitting type light-emitting diode, the method comprising the steps of:
   depositing an n-type epitaxial layer on a substrate;
   etching the n-type epitaxial layer and the substrate to divide the n-type epitaxial layer into a plurality of blocks elevated on the substrate in a matrix-shape;
   forming an isolator layer on a sidewall of the n-type epitaxial layer as well as a periphery portion of a top surface of the n-type epitaxial layer except for a central region of The top surface;
   forming a p-n junction by forming a p-type epitaxial layer on a top surface of the n-type epitaxial layer by doping p-type ions using the isolator layer as a mask; and
   cuffing the blocks to provide a plurality of light-emitting diodes.

8. The method of claim 7, wherein the isolator layer is formed of oxide or polymer.

9. The method of claim 8, wherein the isolator layer is deposited having a thickness of about λ/4n (where, the λ indicates wavelength of light emitted from the LED, and the n indicates the refraction index of a material of the isolator layer).

10. The method of claim 8, wherein the isolator layer is formed through a lift-off process.

11. The method of claim 8, wherein the p-type ions are doped through an ion implantation process.

12. The method of claim 11, wherein when the p-type ions are doped through the ion implantation process, the isolator layer is used as the mask for blocking the ions.

13. The method of claim 11, wherein when the p-type ions are doped through the ion implantation process, the p-type epitaxial layer is formed in a specific shape by forming a mask in the specific shape when the p-type ions are doped through the ion implantation process.

* * * * *